(12) United States Patent
Niwa

(10) Patent No.: US 6,218,721 B1
(45) Date of Patent: Apr. 17, 2001

(54) SEMICONDUCTOR DEVICE AND METHOD OF MANUFACTURING THE SAME

(75) Inventor: Kenji Niwa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/006,222

(22) Filed: Jan. 13, 1998

(30) Foreign Application Priority Data

Jan. 14, 1997 (JP) .................................... 9-004582

(51) Int. Cl.⁷ .................................................. H01L 29/00
(52) U.S. Cl. ......................... 257/529; 438/132; 438/662
(58) Field of Search ............................. 438/132, 600, 438/601, 940, 662, 656, 668; 257/529, 209

(56) References Cited

U.S. PATENT DOCUMENTS

| 4,670,970 | * | 6/1987 | Bajor ...................................... 29/584 |
| 5,233,217 | * | 8/1993 | Dixit et al. ............................ 257/530 |
| 5,376,820 | * | 12/1994 | Crafts et al. .......................... 257/529 |
| 5,679,967 | * | 10/1997 | Janai et al. ............................ 257/209 |
| 5,827,759 | * | 10/1998 | Froehner ............................... 438/132 |

FOREIGN PATENT DOCUMENTS

| 0887859A2 | * | 12/1998 | (EP) ............................. H01L/23/525 |
| 6-53323 | | 2/1994 | (JP) . |

* cited by examiner

*Primary Examiner*—Caridad Everhart
(74) *Attorney, Agent, or Firm*—Young & Thompson

(57) ABSTRACT

A semiconductor device includes a fuse constituted by a lower interconnection, an upper metal interconnection, and a plug. The lower interconnection is formed on a semiconductor substrate. The upper metal interconnection is formed on the lower interconnection through interlevel insulating film to have an overlap region that overlaps at least part of the lower interconnection. The plug is formed in the overlap region to electrically connect the upper metal interconnection and the lower interconnection to each other. A method of manufacturing a semiconductor device is also disclosed.

14 Claims, 9 Drawing Sheets

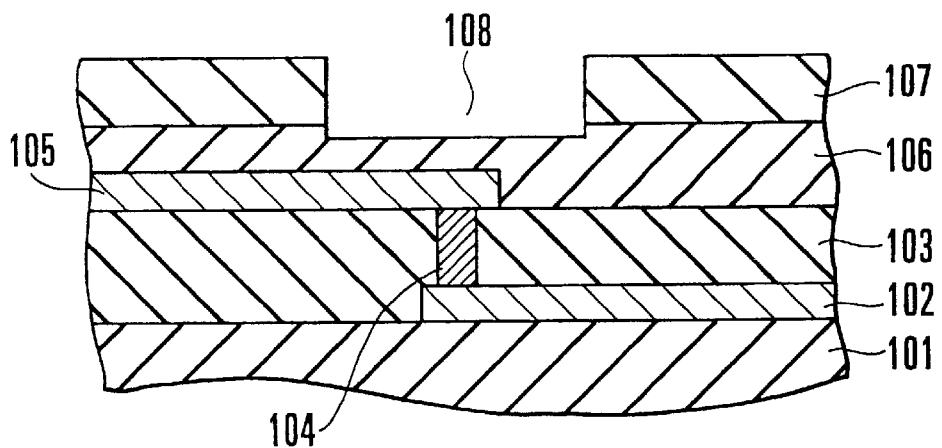
F I G. 1A
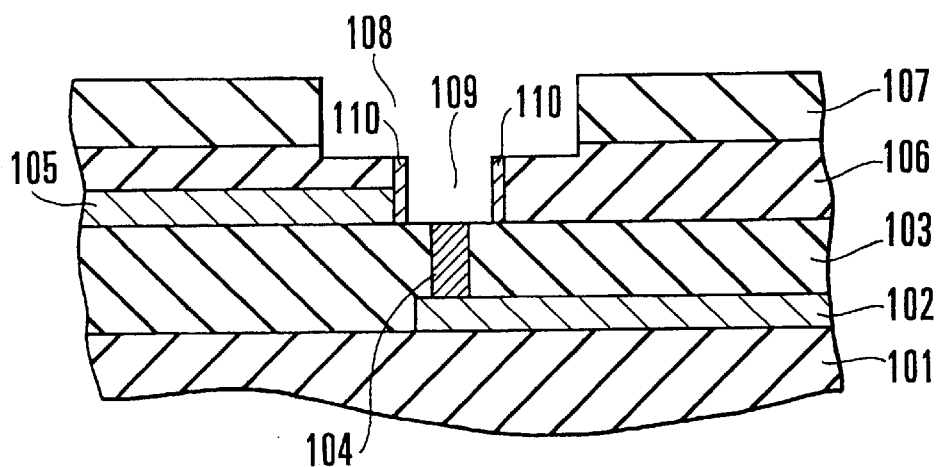
F I G. 1B
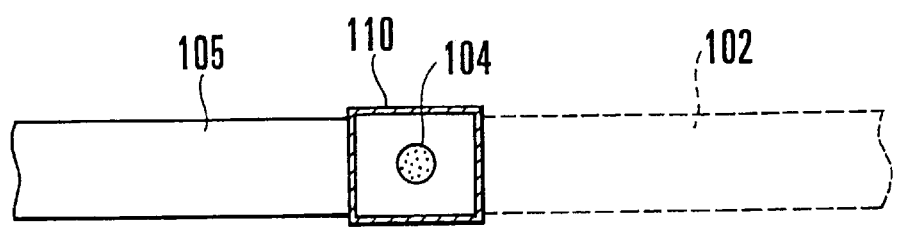
F I G. 1C

SEMICONDUCTOR DEVICE AND METHOD OF MANUFACTURING THE SAME

BACKGROUND OF THE INVENTION

The present invention relates to a semiconductor device which has a fuse and is used for replacement of a redundant cell or the like, and a method of manufacturing the same.

In recent years, the degree of integration of semiconductor devices increases more and more, and accordingly the manufacturing yield generally tends to decrease. In particular, in a recent semiconductor memory device, several extra redundant bit cells are included in a memory cell array to replace a defective bit cell. Therefore, even if a defective bit cell is generated, the chip that includes this defective bit cell need not be determined as a defective chip, so that a decrease in yield is prevented.

To replace the defective bit cell with the redundant bit cell, as will be described later, a fuse interconnection which has been made in advance is fusion-disconnected by a laser or the like, and the circuit connection is altered.

For example, FIG. 8 shows a circuit diagram including a redundant circuit which saves a defective memory cell with a preliminary redundant memory cell. Reference numeral 801 denotes a power supply Vcc; 802, a GND; 803 and 809, capacitors; 804 and 810, fuses; 805, 806, 807, 811, 812, and 817, inverter circuits; 808a, a redundant line selection circuit; 813, an XOR circuit; 814a and 814b, address selection circuits; 815, a NAND circuit as the decoder of the redundant line; 816, a signal for disabling a regular decoder; and 818, a redundant line.

The operation of the redundant circuit shown in FIG. 8 will be described. In a normal operation in which the redundant circuit is not used, the fuse 804 is grounded to the GND 802. Accordingly, a low "L" level signal is input to the inverter circuit 805. The output of the inverter circuit 805 changes to high "H" level and input to the next-stage inverter circuit 807. The inverter circuit 806 latches an "H" level signal.

A signal re output from the inverter circuit 807 changes to "L" level, and the output 816 of the NAND circuit 815 is constantly at "H" level. The redundant line 818 is inverted by the inverter circuit 817 to be constantly at "L" level. Therefore, the redundant line 818 is in a non-selected state.

When the redundant line is used, the fuse 804 in the redundant line selection circuit 808a is disconnected, and simultaneously the fuses 810 in the address selection circuits 814a and 814b corresponding to a defective address are also disconnected as required.

Since the fuse 804 in the redundant line selection circuit 808a is disconnected as described above, an "H" level signal is input from the capacitor 803 connected to the power supply Vcc 801 to the inverter circuit 805. As a result, the signal re changes to "H" level, and selection of the redundant line 818 is enabled.

At this time, when information of the fuses 810 in the address selection circuits 814a and 814b and information of address signals $a_0$ to $a_i$ input from the outside become equal, all signals $ra_0$ to $ra_1$ change to "H" level. As a result, the output 816 from the NAND circuit 815 changes to "L" level to disable the regular decoder. The signal of the redundant line 818 changes to "H" level, so that the redundant line is selected.

FIGS. 9A to 9D show the arrangement of the fuse interconnection. An interlevel insulating film 901 is formed on interconnection layers and the like formed on predetermined elements, and metal interconnections 902 made of Al or the like are formed on the interlevel insulating film 901. The metal interconnections 902 serve as the fuse interconnections.

An interlevel insulating film 903 and a passivation film 904 are formed on the metal interconnections 902. An opening portion 905 is formed at a predetermined position of the passivation film 904 to extend to an intermediate portion of the interlevel insulating film 903. The opening portion 905 is formed to shorten the distance from the surface to the metal interconnections 902.

Disconnection of the metal interconnections 902 will be described. As shown in the plan view of FIG. 9B, disconnection of the metal interconnections 902 is performed by irradiating a laser beam having an aperture size of about 2.5 $\mu m^2$ to predetermined laser irradiation regions 906 on the metal interconnections 902 in the opening portion 905. This laser irradiation is performed for 20 ms to 100 ms in a pulse manner.

This laser irradiation disconnects (by fusion) the metal interconnections 902 into metal interconnections 902a and 902b, as shown in FIG. 9C.

The irradiated portions of the metal interconnections 902 which are subjected to laser irradiation evaporate instantaneously. As a result, the metal interconnections 902 are fusion-disconnected by laser irradiation. Since this evaporation takes place explosively, it blows off part of the interlevel insulating film 901 and part of the interlevel insulating film 903 under and on the metal interconnections 902 to form holes 907.

Although the metal interconnections 902 serving as the fuse interconnections are conventionally fusion-disconnected, as described above, they cannot often be disconnected electrically.

More specifically, although the metal interconnections 902 are fusion-disconnected by laser irradiation, the metal material that evaporates during laser irradiation is deposited on the side walls of the holes 907 again to form metal films 908.

As shown in FIGS. 9C and 9D, since the metal films 908 are formed on the entire portions of the side walls of the respective holes 907, the metal interconnections 902a and 902b that are fusion-disconnected are electrically connected to each other through the metal films 908.

According to a conventional technique, an interconnection made of polysilicon is used as the fuse interconnection (for example, Japanese Patent Laid-Open No. 6-53323). Since polysilicon can be disconnected easily by laser irradiation and is not easily deposited again, the problem as described above does not arise easily.

However, to form a polysilicon interconnection, a high-temperature atmosphere is required. If an interconnection employing a metal is formed as the underlying layer, it is melted by the high-temperature atmosphere employed for formation of the polysilicon interconnection on it. For this reason, a polysilicon interconnection cannot accordingly be formed. When polysilicon is employed as the material of the fuse interconnection, the polysilicon fuse interconnection must be arranged as the lowest layer.

More specifically, when polysilicon is used as the material of the fuse interconnection and large numbers of interconnection layers and interlevel insulating films are formed on the polysilicon fuse interconnection, a deep opening portion must be formed to disconnect the fuse interconnection. When polysilicon is to be employed as the material of the fuse interconnection, the entire process is complicated and controllability for the remaining portion of the interlevel insulating film on the fuse interconnection is degraded, so that the fuse disconnection hit rate is extremely lowered.

SUMMARY OF THE INVENTION

The present invention has been made to solve the above problem, and has as its object to facilitate control for the remaining portion of an interlevel insulating film on a fuse interconnection without complicating the process and to improve a fuse disconnection hit rate.

In order to achieve the above object, according to the present invention, there is provided a semiconductor device comprising a fuse constituted by a lower interconnection formed on a semiconductor substrate, an upper metal interconnection formed on the lower interconnection through an interlevel insulating film to have an overlap region that overlaps at least part of the lower interconnection, and a conductor portion formed in the overlap region to electrically connect the upper metal interconnection and the lower interconnection to each other.

BRIEF DESCRIPTION OF THE DRAWINGS

FIGS. 1A and 1B, and FIG. 1C are sectional views and a plan view, respectively, showing the arrangement of part of a semiconductor device according to the first embodiment of the present invention;

DESCRIPTION OF THE PREFERRED EMBODIMENTS

Figure 2A:
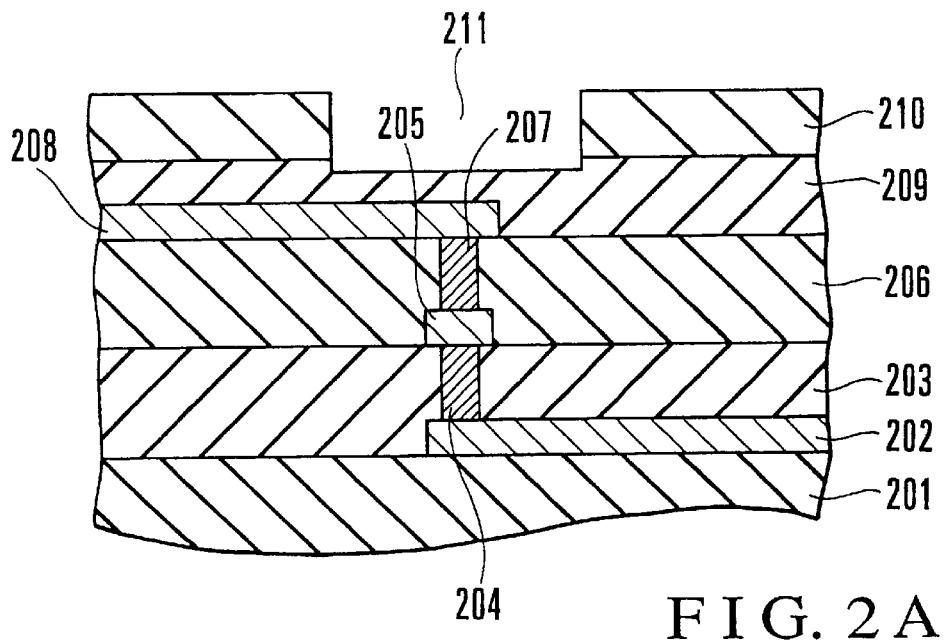
FIGS. 2A and 2B art sectional views showing the arrangement of part of a semiconductor device according to the sec d embodiment of the present invention.

The preferred embodiments of the present invention will be described with reference to the accompanying drawings.

FIGS. 1A to 1C show the arrangement of part of a semiconductor device according to the first embodiment. In the first embodiment, predetermined elements are formed on a substrate, and interconnection layers and the like are formed on the predetermined elements. An interlevel insulating film 101 is arranged on this structure, and lower interconnections 102 made of Al or the like are formed on the interlevel insulating film 101. In the first embodiment, upper metal interconnections 105 made of Al or the like are formed on an interlevel insulating film 103 on the lower interconnections 102, such that their end portions are connected to plugs 104 that fill contact holes formed in the interlevel insulating film 103. The plugs 104 are made of a refractory metal, e.g., tungsten.

An interlevel insulating film 106 and a passivation film 107 are formed on the upper metal interconnections 105. An opening portion 108 is formed at a predetermined position of the passivation film 107 so that the interlevel insulating film 106 has a thickness of several 100 nm. The opening portion 108 is formed to shorten the distance from the surface to the upper metal interconnections 105, thereby facilitating fuse disconnection. If the upper metal interconnections 105 can be formed into predetermined shapes by laser irradiation, no opening portion need be formed.

As described above, in the first embodiment, the lower interconnections 102, the plugs 104, and the upper metal interconnections 105 constitute fuse interconnections.

Disconnection of the fuse interconnections will be described.

In the first embodiment, as shown in the sectional view of FIG. 1B, disconnection of the fuse interconnections is performed by irradiating a laser beam having an aperture size of about 2.5 $\mu m^2$ to predetermined regions of the end portions of the upper metal interconnections 105 in the opening portion 108. This laser irradiation is performed for 20 ms to 100 ms in a pulse manner.

By this laser irradiation, portions of the upper metal interconnections 105 located on the plugs 104 disappear, as shown in FIG. 1B. The irradiated portions of the metal interconnections 105 which are subjected to laser irradiation evaporate instantaneously. As a result, the end portions of the upper metal interconnections 105 evaporate upon laser irradiation to disappear. Since this evaporation takes place explosively, it blows off the interlevel insulating film 106 on the end portions of the upper metal interconnections 105 to form holes 109.

Part of the metal material which has evaporated from the end portions of the upper metal interconnections 105 is deposited on the side walls of the holes 109 again, in the same manner as in the conventional example, to form metal films 110. The metal films 110 are formed on the side walls of the holes 109, as shown in the plan view of FIG. 1C.

However, no metal films 110 are formed on the bottom surfaces of the holes 109.

Therefore, although the metal films 110 are in contact with the upper metal interconnections 105, they are not in contact with the plugs 104.

Therefore according to the first embodiment, the upper metal interconnections 105 and the lower interconnections 102 can be electrically disconnected from each other by removing the end portions of the upper metal interconnections 105 located on the plugs 104 by laser irradiation.

Figure 2B:
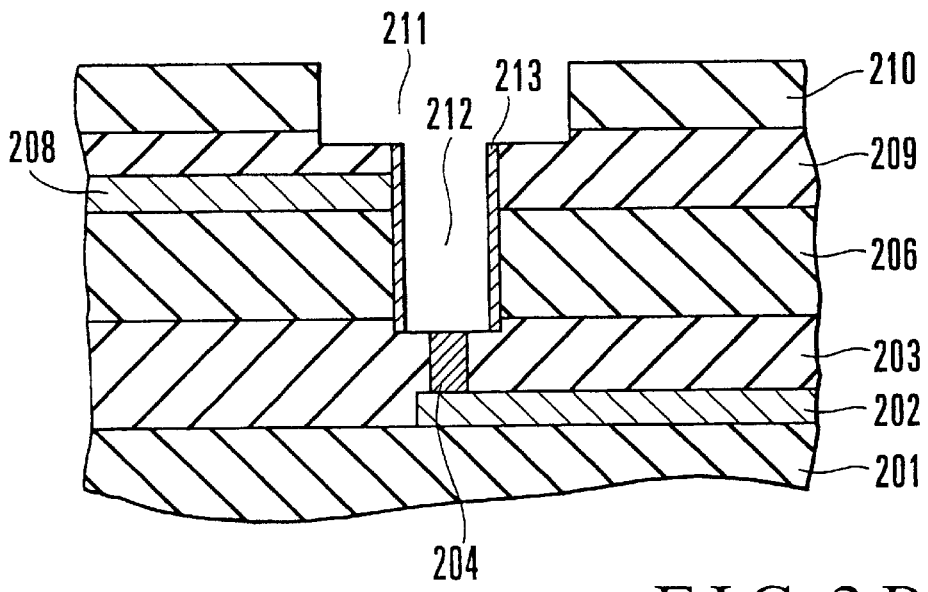

FIGS. 2A and 2B show the arrangement of part of a semiconductor device according to the second embodiment. In the second embodiment, predetermined elements are formed on a substrate, and interconnection layers and the like are formed on the predetermined elements. An interlevel insulating film 201 is arranged on this structure, and lower interconnections 202 are formed on an interlevel insulating film 201. Intermediate interconnections 205 made of Al or the like are formed on the interlevel insulating film 203 on the lower interconnections 202, such that their end portions are connected to plugs 204 that fill contact holes formed in the interlevel insulating film 203.

Upper metal interconnections 208 are formed on an interlevel insulating film 206 on the intermediate interconnections 205, such that their end portions are connected to plugs 207 that fill contact holes formed in the interlevel insulating film 206.

An interlevel insulating film 209 and a passivation film 210 are formed on the upper metal interconnections 208. An opening portion 211 is formed at a predetermined position of the passivation film 210 to extend to an intermediate portion of the interlevel insulating film 209. The opening portion 211 is formed to shorten the distance from the surface to the upper metal interconnections 208, and need not be formed if the interlevel insulating film 209 and passivation film 210 are thin.

As described above, in the second embodiment, the lower interconnections 202, the plugs 204, the intermediate interconnections 205, the plugs 207, and the upper metal interconnections 208 constitute fuse interconnections.

Disconnection of the fuse interconnections will be described.

In the second embodiment, disconnection of the fuse interconnections is performed by irradiating a laser having an aperture size of about 2.5 $\mu m^2$ to predetermined regions of the end portions of the upper metal interconnections 208 in the opening portion 211. This laser irradiation is performed for 20 ms to 100 ms in a pulse manner.

When the output from the irradiated laser is large, not only the end portions of the upper metal interconnections 208 but also the intermediate interconnections 205 under them are irradiated with the laser beam, and both of these portions irradiated with laser beam disappear. At this time, the portions that are irradiated with the laser beam evaporate instantaneously. Since this evaporation takes place explosively, it forms holes 212, as shown in FIG. 2B.

These holes 212 extend to part of the interlevel insulating film 203, and metal films 213 are formed on the side walls of the holes 212 by re-deposition.

However, since no metal films 213 are formed on the bottom portions of the holes 212, the metal films 213 are not in contact with the plugs 204.

Therefore, if fuse interconnections are formed as in this second embodiment (FIGS. 2A and 2B), even if the output from the irradiated laser is excessively large, unless the laser output does not reach the lower interconnections 202, the upper metal interconnections 208 and the lower interconnections 202 will not be connected to each other after fuse disconnection.

Therefore, according to the second embodiment, laser irradiation for the purpose of fuse disconnection suffices if it can remove at least the end portions of the upper metal interconnections 208 but does not reach the lower interconnections 202, leading to a wide output range of acceptable laser power for irradition.

FIGS. 3A to 3D show the arrangement of part of a semiconductor device according to the third embodiment. In the third embodiment, predetermined elements are formed on a substrate, and interconnection layers and the like are formed on the predetermined elements. An interlevel insulating film 301 is arranged on this structure, and lower interconnections 302 made of Al or the like are formed on the interlevel insulating film 301.

In the third embodiment, an upper metal interconnection 305 made of Al or the like is formed on an interlevel insulating film 303 on the lower interconnections 302, such that its end portion is connected to plugs 304 that fill contact holes formed in the interlevel insulating film 303. An assembly pad 311 is formed simultaneously. As shown in the plan view of FIG. 3B, the upper metal interconnection 305 is formed to have a wide area so as to be connected to, e.g., three lower interconnections. The plugs 304 are made of a refractory metal, e.g., tungsten or the like.

An interlevel insulating film 306 and a passivation film 307 are formed on the upper metal interconnection 305 and the assembly pad 311. Subsequently, portions of the interlevel insulating film 306 and passivation film 307 in a region inside the upper metal interconnection 305 and assembly pad 311 are removed by etching to form an opening portion 308 and an opening portion 312, thereby exposing the upper metal interconnection 305 and the surface of the assembly pad 311.

As described above, in the third embodiment, the upper metal interconnection 305 formed to have a wide area is connected to, e.g., the three lower interconnections 302 and three plugs 304, thereby constituting fuse interconnections.

Disconnection of the fuse interconnections will be described.

Figure 3A:
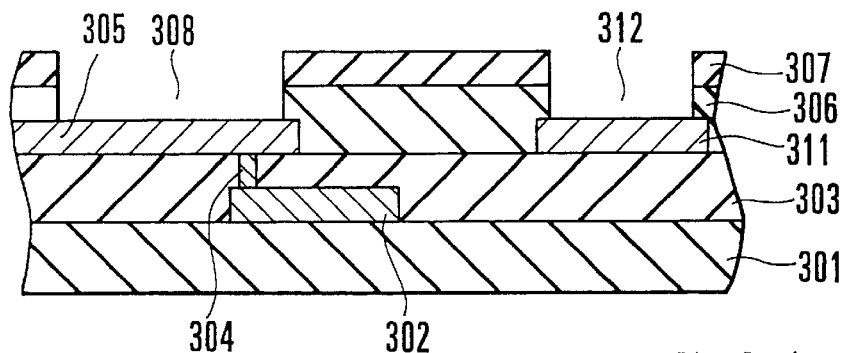
FIGS.3A and 3C, and FIGS. 3B and 3D are sectional views and plan views, respectively, showing the arrangement of part of a semiconductor device according to the third embodiment of the present invention.
Figure 3B:
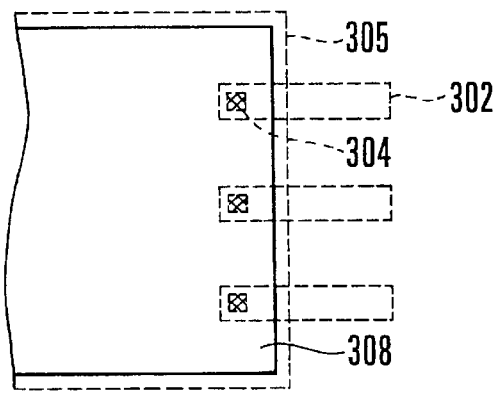

In the third embodiment, as shown in the sectional view of FIG. 3B, disconnection of the fuse interconnections is performed by irradiating a laser having an aperture of about 2.5 $\mu m^2$ to predetermined regions of the upper metal interconnection 305 exposed to the opening portion 308. This laser irradiation is performed for 20 ms to 100 ms in a pulse manner.

Figure 3C:
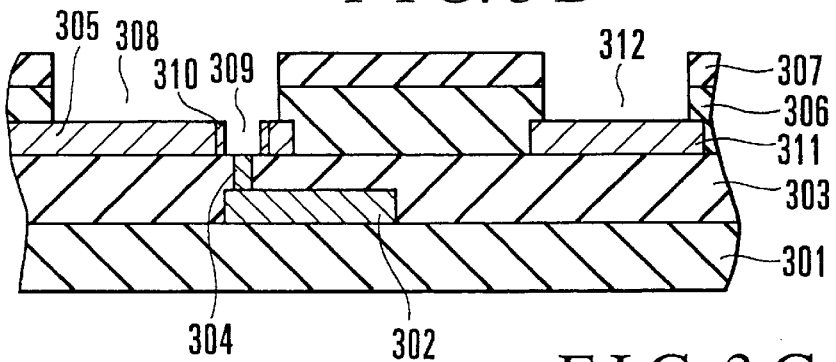
Figure 3D:
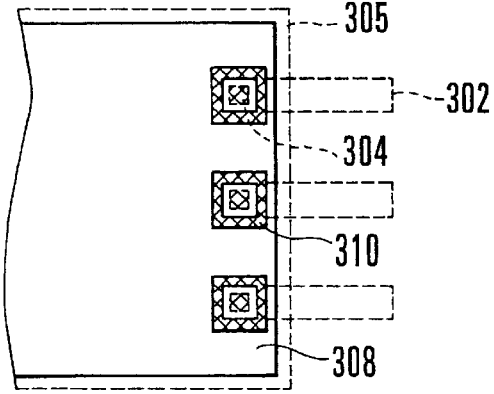

By this laser irradiation, portions of the upper metal interconnection 305 located on the plugs 304 disappear, as shown in FIG. 3C. The irradiated portions of the metal interconnections 305 which are subjected to laser irradiation evaporate instantaneously. As a result, the regions of the upper metal interconnection 305 subjected to laser irradiation evaporate to disappear, thus forming holes 309. In the third embodiment, since the laser beam is irradiated while the upper metal interconnection 305 is exposed, desired regions of the upper metal interconnection 305 can be evaporated easily and is thus removed.

Part of the metal material which has evaporated from the upper metal interconnection 305 is deposited on the side walls of the holes 309 again, in the same manner as in the first embodiment, to form metal films 310. The metal films 310 are formed on the side walls of the holes 309, as shown in the plan view of FIG. 3D.

However, no metal films 310 are formed on the bottom surfaces of the holes 309. Therefore, although the metal films 310 are in contact with the upper metal interconnection 305, they are not in contact with the plugs 304. Therefore, according to the third embodiment, regions of the upper metal interconnection 305 which are located on the plugs 304 are removed by laser irradiation so that electrical connection of the upper metal interconnection 305 and lower interconnections 302 can be disconnected.

In the third embodiment, since the upper metal interconnection 305 is formed to have a large area, the opening portion 308 can be formed simultaneously with formation of the opening portion 312 on the assembly pad 311. No new process need be added to expose the desired regions of the upper metal interconnection 305, and an increase in number of steps can be prevented.

FIGS. 4A to 4D show the arrangement of part of a semiconductor device according to the fourth embodiment.

In the fourth embodiment, a plurality of fuse interconnections are particularly arranged to be parallel to each other at a small interval.

Figure 4A:
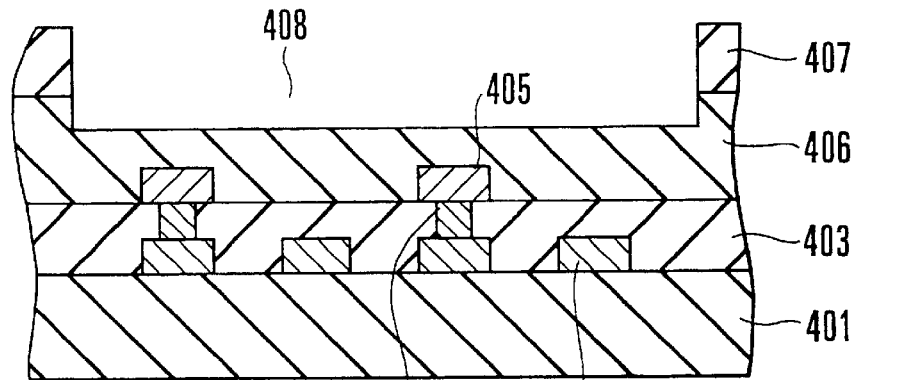
FIGS. 4A and 4C, and FIGS. 4B and 4D are sectional views and plan views, respectively, showing the arrangement of part of a semiconductor device according to the fourth embodiment of the present invention.

As shown in FIG. 4A, predetermined elements are formed on a substrate, and interconnection layers and the like are formed on the predetermined elements. An interlevel insulating film 401 is formed on the resultant structure. Lower interconnections 402 made of Al or the like are formed on the interlevel insulating film 401. Upper metal interconnections 405 are formed on the lower interconnections 402 through an interlevel insulating film 403. The upper metal interconnections 405 are connected to the lower interconnections 402 through plugs 404. An interlevel insulating film 406 and a passivation film 407 are formed on the upper metal interconnections 405. An opening portion 408 is formed at a predetermined position of the passivation film 407 such that the interlevel insulating film 406 has a thickness of several 100 nm.

Figure 4B:
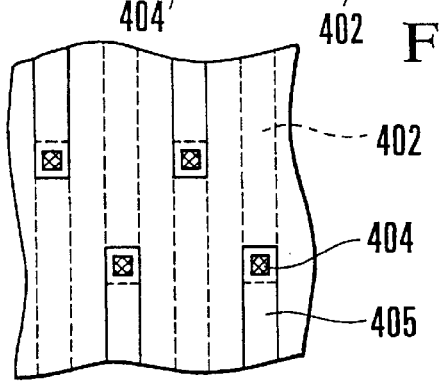
Figure 4C:
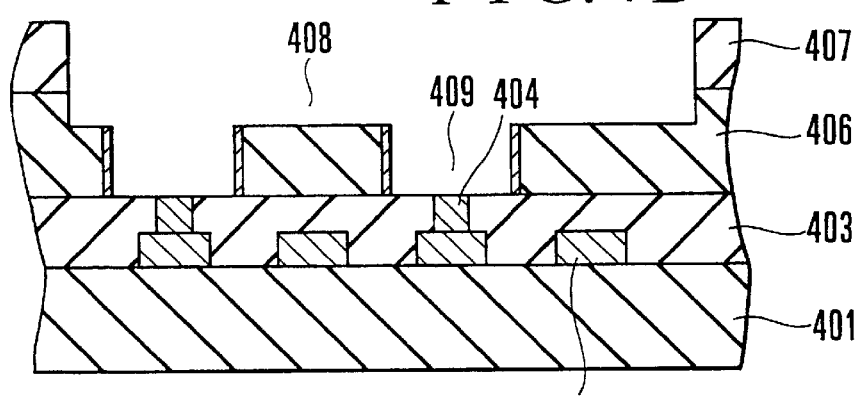
Figure 4D:
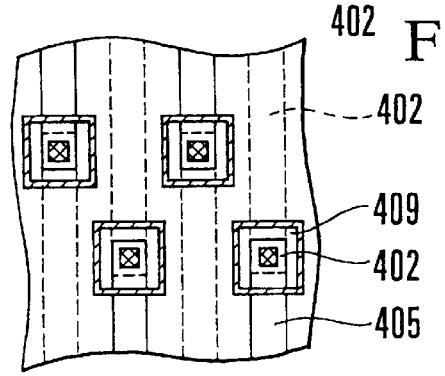

In the fourth embodiment, in adjacent fuse interconnection sets, each consisting of a lower interconnection 402, a plug 404, and an upper metal interconnection 405, the directions of the upper metal interconnections 405 extending from the plugs 404 differ from each other, and the upper metal interconnections 405 are not adjacent to each other. As a result, the distance between the plugs 404 becomes larger than the fuse interconnection interval, as shown in FIG. 4B.

The plugs 404 are set apart from each other so that, of the adjacent fuse interconnections, holes 409 which are formed upon fuse disconnection do not overlap each other.

As a result, according to the fourth embodiment, a hole 409 which is formed by disconnecting one fuse interconnection set will not adversely affect the upper metal interconnections 405 and plugs 404 of an adjacent fuse interconnection.

Figure 5A:
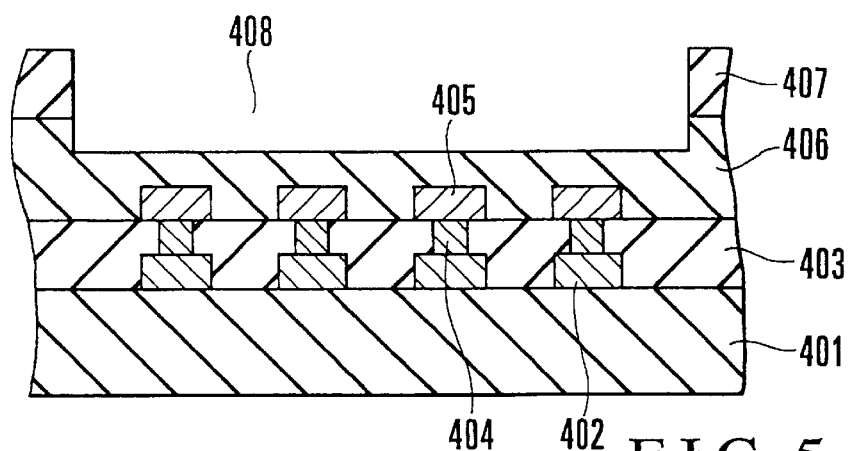
FIGS. 5A and 5C, and FIGS. 5B and 5D are sectional views and plan views, respectively, showing the arrangement of part of a semiconductor device to be compared with the fourth embodiment.
Figure 5B:
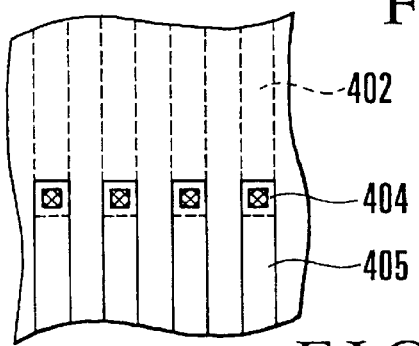
Figure 5C:
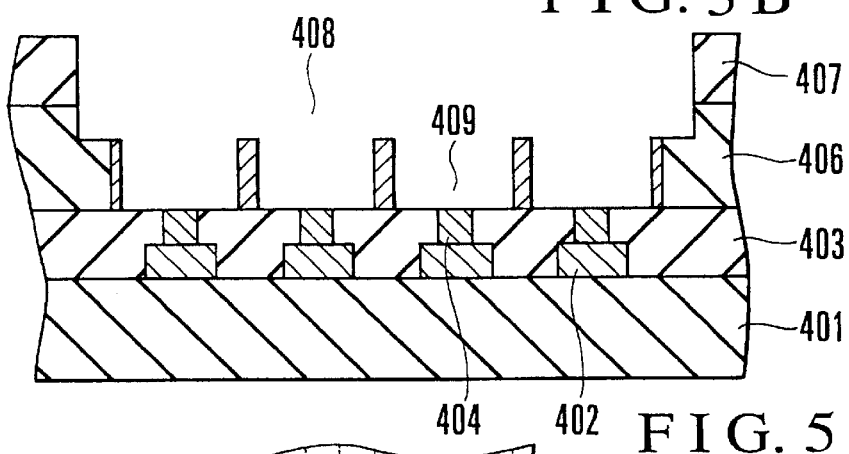
Figure 5D:
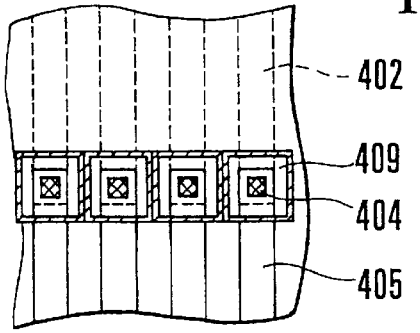

Concerning this, as shown in FIGS. 5A to 5D, if adjacent upper metal interconnections 405 extend in the same direction, each plug 404 and the upper metal interconnection 405 of the adjacent fuse interconnection become close to each other. Then, when the fuse is disconnected, it will adversely affect the adjacent fuse interconnection region, as shown in FIGS. 5C and 5D.

For example, assume that the upper metal interconnections 405 are formed with an interconnection width of 1 μm and that the interlevel insulating film 406 on the upper metal interconnections 405 has a thickness of 1 μm. If fuse disconnection is performed by laser irradiation, holes 409 are formed to have a diameter of about 6 μm. Accordingly, when the plugs 404 and the upper metal interconnections 405 are arranged as shown in FIGS. 5A to 5D, unless the upper metal interconnections 405 are separated from each other by a distance larger than 6 μm, each hole 409 formed by fuse disconnection adversely affects the upper metal interconnection 405 of the adjacent fuse interconnection.

Concerning this, as shown in FIGS. 4A to 4D, the upper metal interconnections 405 of adjacent fuse interconnections are set such that they do not exist adjacent to each other but extend in different directions. If the plugs 404 are separated from each other by a distance equal to or larger than a predetermined distance, as described above, even if the distance among the interconnections becomes as small as about 3 μm, an adverse influence of fuse disconnection to an adjacent fuse interconnection can be suppressed.

Therefore, according to the fourth embodiment, the regions where the fuse interconnections are formed can be further reduced.

FIGS. 6A to 6D show the arrangement of part of a semiconductor device according to the fifth embodiment. In the fifth embodiment, predetermined elements are formed on a substrate, and interconnections and the like are formed on the predetermined elements. An interlevel insulating film 501 is arranged on the resultant structure, and lower interconnections 502a and 502b made of Al or the like are formed on the interlevel insulating film 501. An interlevel insulating film 503 is formed on the lower interconnections 502a and 502b. Plugs 504a and 504b fill contact holes formed in portions of the interlevel insulating film 503 located on the end portions of the lower interconnections 502a and 502b.

An upper metal interconnection 505 is formed on the interlevel insulating film 503 to connect the plugs 504a and 504b to each other.

An interlevel insulating film 506 and a passivation film 507 are formed on the upper metal interconnection 505, and an opening portion 508 extending to an intermediate portion of the interlevel insulating film 506 is formed at a predetermined position of the passivation film 507. The opening portion 508 is formed to shorten the distance from the surface to the upper metal interconnection 505, and need not be formed if the interlevel insulating film 506 and passivation film 507 are thin.

As described above, in the fifth embodiment, the lower interconnections 502a and 502b, the plugs 504a and 504b, and the upper metal interconnection 505 constitute a fuse interconnection.

Disconnection of this fuse interconnection will be described.

In the fifth embodiment as well, disconnection of the fuse interconnection is performed by irradiating a laser beam having an aperture size of about 2.5 $\mu m^2$ to a predetermined region of the end portion of the upper metal interconnection 505 in the opening portion 508. This laser irradiation is performed for 20 ms to 100 ms in a pulse manner.

Figure 6A:
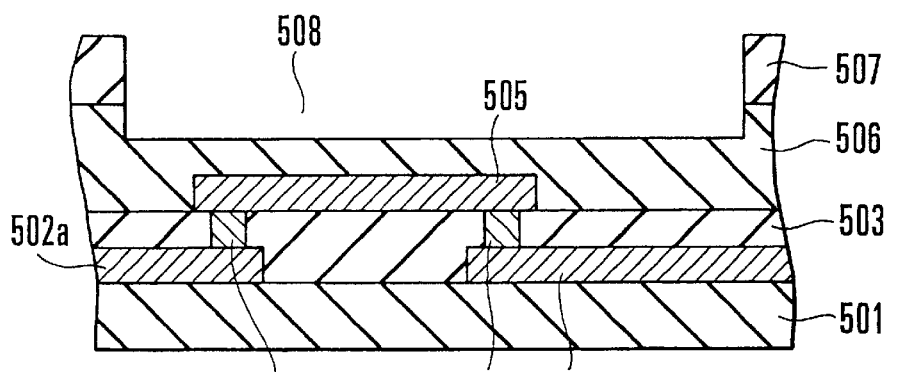
FIGS. 6A to 6D are sectional views showing the arrangement of part of a semiconductor device according to the fifth embodiment of the present invention.
Figure 6B:
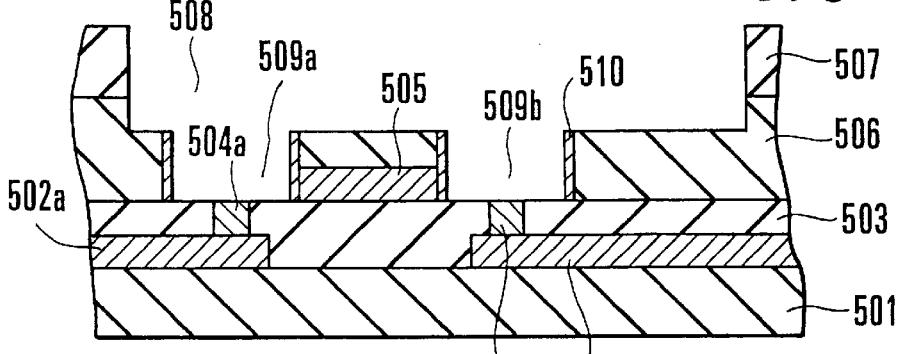

By this laser irradiation, a portion of the upper metal interconnection 505 located on the plug 504a disappears by evaporation, as shown in FIG. 6B. Since this evaporation occurs explosively, it blows off the interlevel insulating film 506 to form a hole 509a.

The hole 509a extends to reach part of the interlevel insulating film 503, and a metal film 510 is formed on the side wall of the hole 509a by deposition of the evaporated interlevel insulating film 506.

However, since no metal film 510 is formed on the bottom portion of the hole 509a by re-deposition, the metal film 510 and the plug 504a are not in contact with each other. In the fifth embodiment, also at the plug 504b portion, a predetermined region on the end portion of the upper metal interconnection 505 in the opening portion 508 is irradiated with laser beam to form a hole 509b. Therefore, in the fifth embodiment, one fuse interconnection set is disconnected at two portions by fusion.

Assuming that when a portion on one plug is fusion-disconnected by laser irradiation, the disconnection success rate of this portion is, e.g., 95%, then the fuse disconnection success rate in the first embodiment described above becomes 95%. In contrast to this, in the fifth embodiment, since the fuse disconnection failure rate on the plug 504a is 5% and the fuse disconnection failure rate on the plug 504b is 5%, the probability of failing in to disconnect at both portions becomes 0.25%. In other words, the disconnection success rate of the fifth embodiment is 99.75%, and the fuse disconnection success rate can accordingly be improved remarkably.

Figure 6C:
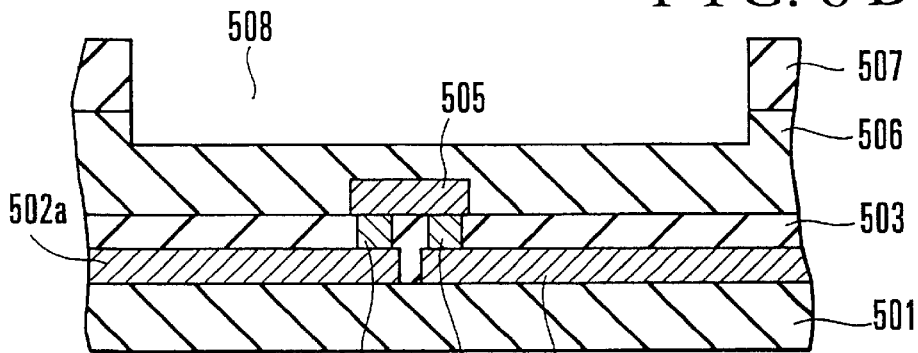
Figure 6D:
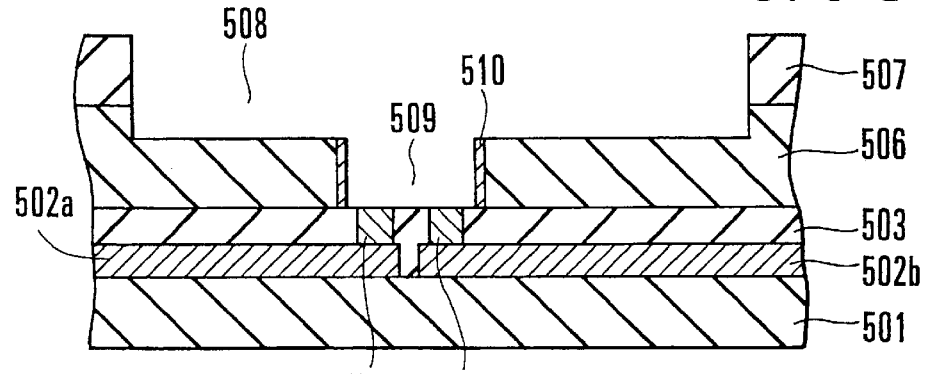

Although the plugs 504a and 504b are formed to be separate from each other in the above description, they can be arranged close to each other, as shown in FIG. 6C. Then, if the upper metal interconnection 505 is irradiated with laser beam to almost correspond to a portion between the plugs 504a and 504b, disconnection of the plug 504a and upper metal interconnection 505 from each other and disconnection of the plugs 504b and upper metal interconnection 505 from each other can be performed simultaneously by only forming one hole 509, as shown in FIG. 6D. Disconnection is performed at two portions in this case as well, so that the disconnection success rate can be improved in the same manner as described above.

Figure 7A:
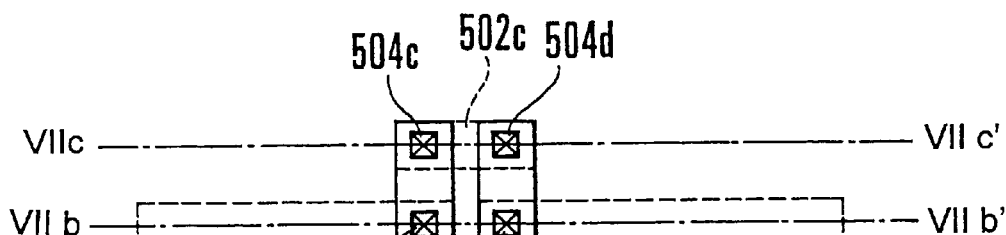
FIG. 7A and FIGS. 7B and 7C are a plan view and sectional views, respectively, showing the arrangement of another example of a semiconductor device according to the fifth embodiment of the present invention.
Figure 7B:
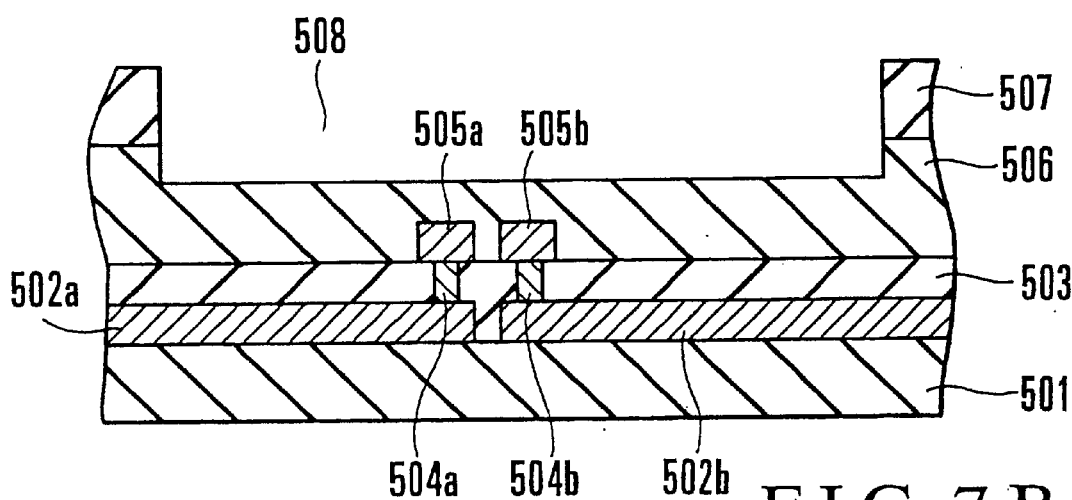
Figure 7C:
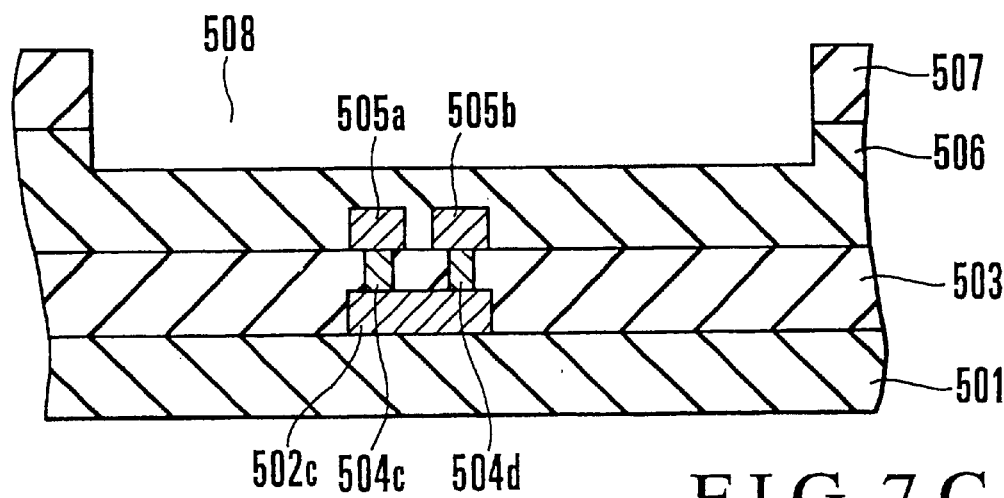
Figure 8:
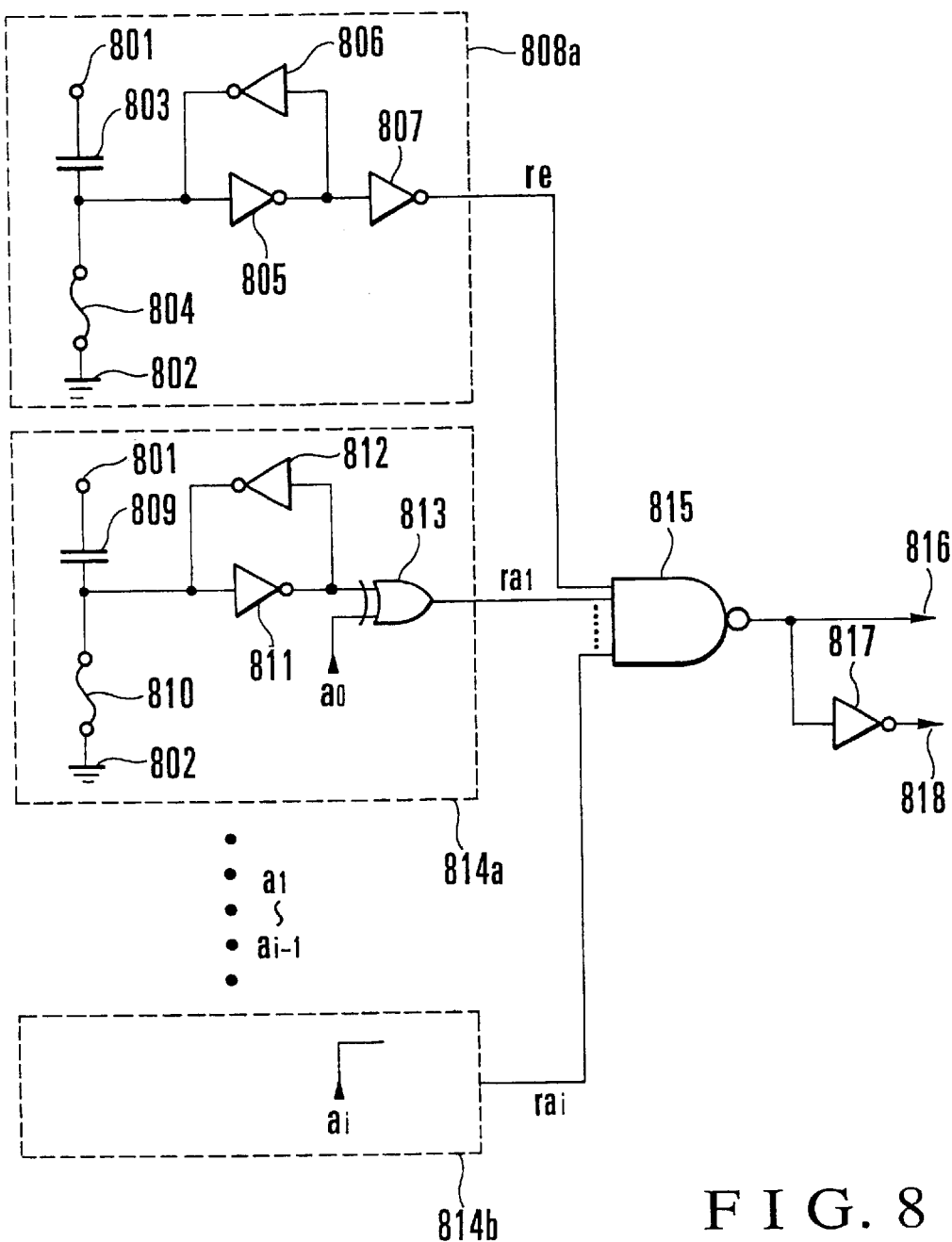
FIG. 8 is a circuit diagram including a redundant circuit which remedies a defective memory cell with preliminary redundant memory cell.
Figure 9:
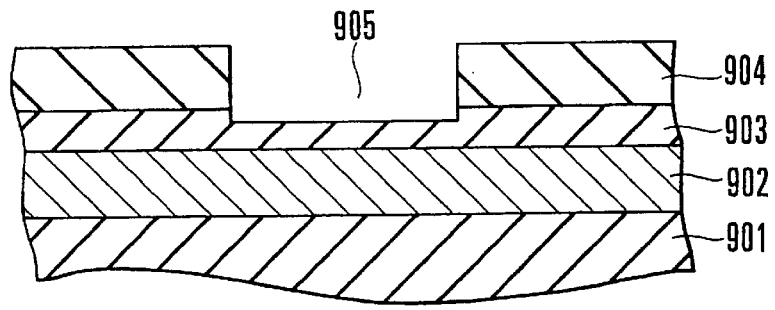
FIGS. 9A to 9D are views showing the arrangement of conventional fuse interconnections.
Figure 9:
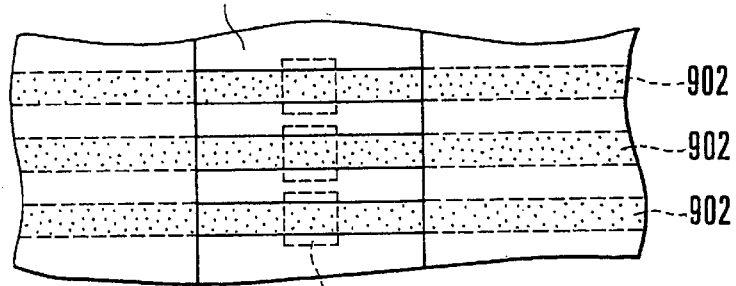
Figure 9:
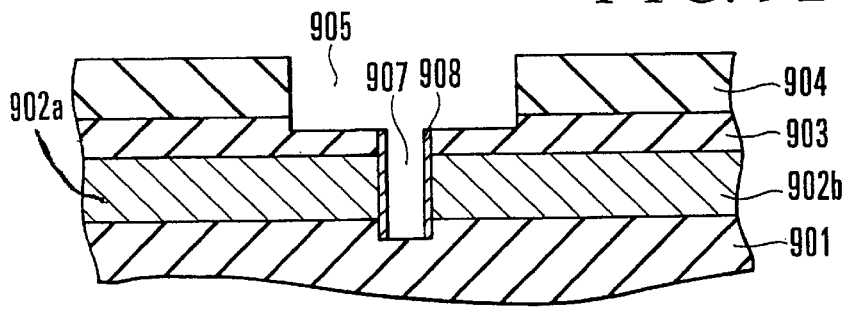
Figure 9:
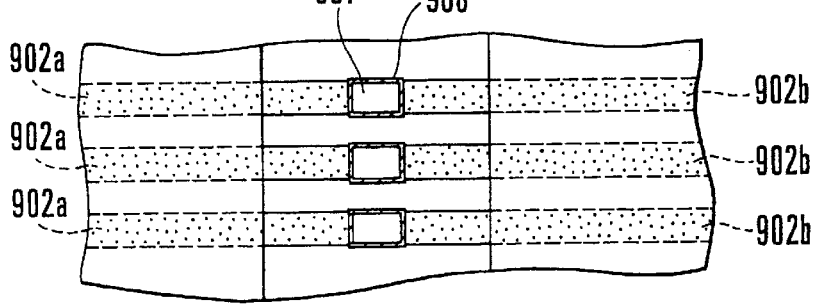

As shown in FIG. 7A, in addition to lower interconnections 502a and 502b, a lower interconnection 502c may be formed in the same interconnection layer, so that a line extending through the lower interconnection 502a, a plug 504a, an upper metal interconnection 505a, a plug 504c, the lower interconnection 502c, a plug 504d, an upper metal interconnection 505b, a plug 504b, and the lower interconnections 502b constitutes a fuse interconnection. FIG. 7B shows a section taken along the line VIIB–VIIB ' of FIG. 7A, and FIG. 7C shows a section taken along the line VIIC–VIIC' of FIG. 7A.

If the region where the plugs 504a to 504d are formed, and the upper metal interconnections 505a and 505b are located within the region of the hole 509 formed by laser irradiation, as described above, the fuse interconnection described above can be disconnected by one laser irradiation operation.

In this case, the four plugs 504a to 504d are present in one fuse interconnection. Namely, the probability of failing in disconnection on all of the plugs 504a to 504d is $0.05^4 = 0.00000625$. The fuse disconnection success rate becomes 99.999375%, thus achieving a further improvement.

In the above description, two or four plugs are arranged in one fuse interconnection, and are connected in series to each other. However, the number of plugs is not limited to this, but can be increased or decreased in accordance with the fuse interconnection region.

In the first to fifth embodiments, Al is employed as the material of the upper metal interconnection. However, the present invention is not limited to this, and another metal, e.g., Cu or Ni, can be used.

As the material of the plug, a refractory metal is employed. However, the present invention is not limited to this, and the same material as that of the upper metal interconnection, e.g., Al, can be used. For example, if a burying interconnection technique with which filling of the plug and formation of the upper metal interconnection are performed simultaneously is employed, the upper metal interconnection and the plug are automatically made of the same material.

In the first to fifth embodiments, Al is used as the material of the lower interconnection. However, the present invention is not limited to this, and another metal, e.g., Cu or Ni, can be used. In addition, if the lower interconnection is formed closer to the substrate, a semiconductor material, e.g., polysilicon, can be used.

As has been described above, according to the present invention, the fuse interconnection is constituted by a lower interconnection formed on a semiconductor substrate, an interlevel insulating film formed on the lower interconnection, a plug that fills a contact hole formed in the interlevel insulating film to come into contact with the lower interconnection, and an upper metal interconnection formed on the interlevel insulating film to come into contact with the plug.

The fuse interconnection having the above arrangement is disconnected by removing a portion of the upper metal interconnection which is located on the plug.

Upon removal of the upper metal interconnection, even if the material of the upper metal interconnection attaches to the structure again, this material does not come into contact with the plug.

As a result, according to the present invention, the upper metal interconnection and the lower interconnection can be electrically isolated from each other by removing a portion of the upper metal interconnection which is located on the plug. Therefore, control for the remaining portion of the interlevel insulating film on the fuse interconnection can be facilitated without complicating the process, and the fuse disconnection success rate can be improved.

What is claimed is:

1. A semiconductor device comprising a connected fuse constituted by:

first and second lower interconnections formed on a semiconductor substrate;

an interlevel insulating film on said first and second lower interconnections;

an upper metal interconnection formed on said interlevel insulating film to define an overlap region in said interlevel insulating film that overlaps at least part of said first and said second lower interconnections; and first and second conductor portions formed in said overlap region to electrically connect, respectively, said upper metal interconnection and said first lower interconnection to each other, and said upper metal interconnection and said second lower interconnection to each other.

2. A semiconductor device comprising a connected fuse constituted by:

first, second, and third lower interconnections formed on a semiconductor substrate;

an interlevel insulating film formed on said first, second, and third lower interconnections;

first and second upper metal interconnections formed on said interlevel insulating film to define a plurality of overlap regions in said interlevel insulating film that overlap at least a part of said first, second, and third lower interconnections; and first, second, third, and fourth conductor portions formed in said overlap regions to electrically connect said first and said second upper metal interconnections and said first, second, and third lower interconnections to each other.

3. A method of manufacturing a semiconductor device comprising an open fuse constituted by a lower interconnection, an interlevel insulating film formed on the lower interconnection, an upper metal interconnection formed on the interlevel insulating film to define an overlap region that overlaps at least part of the lower connection, and a conductor portion formed in the overlap region to electrically connect the upper metal interconnection and the lower interconnection to each other, comprising the step of disconnecting the upper metal interconnection from the conductor portion by forming a hole through the upper metal interconnection to i) expose a surface of the conductor portion and a surface of the interlevel insulating film, ii) remove all of the upper metal interconnection from a bottom of the hole, and iii) leave a gap between the exposed surface of the conductor portion and sidewalls of the hole, thereby disconnecting the fuse.

4. A method according to claim 3, wherein disconnection of the fuse is performed through an insulating film on said upper metal interconnection.

5. A method according to claim 3, wherein disconnection of the fuse is performed by laser irradiation.

6. The method of claim 3, wherein the semiconductor device further comprises a plurality of fuses having an insulating film on the upper metal interconnection, a passivation film on the insulating film, wherein the lower interconnection comprises a plurality of independent lower interconnections, and the conductor portion comprises a plurality of conductor portions each corresponding to an associated one of the plurality of independent lower interconnections, and wherein the upper metal interconnection overlaps the plurality of independent lower interconnections, said disconnecting step further comprising disconnecting the upper metal interconnection from the plurality of conductor portions by forming a plurality of holes through the upper metal interconnection to i) expose a plurality of surfaces of the plurality of conductor portions and a plurality of surfaces of the interlevel insulating film, ii) remove all of the upper metal interconnection from bottoms of the plurality of holes, and iii) leave gaps between each of the plurality of exposed surfaces of the plurality of conductor portions and sidewalls of the plurality of holes, thereby disconnecting the plurality of fuses.

7. The method of claim 3, wherein the semiconductor device further comprises an insulating film on the upper metal interconnection, and a passivation film on the insulating film, and wherein said disconnecting step further comprises forming an opening portion before forming the hole, the opening portion having an area larger than the area of the hole through the upper metal interconnection and extending completely through a region of the passivation film and at least partially into the insulating film.

8. The method of claim 3, wherein the semiconductor device further comprises a plurality of interlevel insulating films, an intermediate conductive interconnection within the plurality of interlevel insulating films, and wherein the conductor portion further comprises an upper conductor portion for connecting the upper metal interconnection and the intermediate conductive interconnection to each other, and a lower conductor portion for connecting the intermediate conductive interconnection and the lower conductive interconnection to each other, and wherein said disconnecting step further comprises:

forming an opening portion before forming a hole through the upper metal interconnection, the opening portion being larger in area than the hole through the upper metal interconnection and extending at least partially through each of the plurality of interlevel insulating films;

disconnecting the upper conductor portion from the intermediate conductive interconnection and the upper metal interconnection; and disconnecting the lower conductor portion from the intermediate conductive interconnection and the lower conductive interconnection.

9. A method of manufacturing a semiconductor device comprising a fuse constituted by a lower interconnection formed on a semiconductor substrate, an interlevel insulating film formed on the lower interconnection, an upper metal interconnection formed on the interlevel insulating film to define an overlap region that overlaps at least part of the lower connection, and a conductor portion formed in the overlap region to electrically connect the upper metal interconnection and the lower interconnection to each other, the method comprising the steps of disconnecting the upper metal interconnection and the conductor portion, thereby disconnecting the fuse, wherein formation of the conductor portion and formation of the upper metal interconnection are performed simultaneously.

10. A semiconductor device with an open fuse, comprising:

a lower electrically conductive layer;

a lower interlayer insulator on said lower electrically conductive layer;

an upper electrically conductive layer on said lower interlayer insulator;

a conductor extending through said lower interlayer insulator to said lower electrically conductive layer;

an upper interlayer insulator on said upper electrically conductive layer, said upper interlayer insulator and said upper electrically conductive layer having a fuse opening therethrough that exposes a surface of said conductor and a surface of said lower interlayer insulator, said fuse opening being larger than said exposed surface of said conductor so that said exposed surface of said conductor is electrically isolated from sidewalls of said fuse opening and said upper electrically conductive layer.

11. The semiconductor device of claim 10, further comprising a plurality of said conductors, said fuse opening containing exposed surfaces of at least two of said plurality of conductors that are each electrically isolated from the sidewalls and said upper electrically conductive layer.

12. The semiconductor device of claim 10, further comprising a plurality of said lower electrically conductive layers.

13. The semiconductor device of claim 10, further comprising a plurality of disconnected fuses having:

a plurality of said lower electrically conductive layers extending in a first direction and arranged so as to not intersect;

a plurality of said upper electrically conductive layers, each of said plurality of upper electrically conductive layers extending in a direction different to said first direction and having an end portion in registration with an end portion of a corresponding one of said plurality of said lower electrically conductive layers;

a plurality of said conductors, each of said conductors extending through said lower interlayer insulator to a corresponding one of said plurality of lower electrically conductive layers;

said upper interlayer insulator and said plurality of upper electrically conductive layers each having a fuse opening therethrough that exposes a surface of one of said plurality of said conductors and a surface of said lower interlayer insulator, said fuse opening being larger than said exposed surface of said one of said plurality of conductors so that said exposed surface of said conductor is electrically isolated from sidewalls of said fuse opening and said plurality of said upper electrically conductive layers, and each of said fuse openings being located at a different distance along said first direction with respect to a next adjacent fuse opening and arranged so as not to overlap each other.

14. A semiconductor device comprising a connected fuse constituted by:
   a lower interconnection formed on a semiconductor substrate;
   an interlevel insulating film formed on said lower interconnection;
   an upper metal interconnection formed on said interlevel insulating film to define an overlap region that overlaps at least part of said lower interconnection;
   a conductor portion formed in said overlap region to electrically connect said upper metal interconnection and said lower interconnection; and
   a further insulating film on said upper metal interconnection,
   wherein said further insulating film has an opening exposing a surface of said upper metal interconnection over said conductor portion that is larger than a region from which said upper metal interconnection is removed for fuse disconnection.

* * * * *